United States Patent [19]

Menzies, Jr. et al.

[11] Patent Number: 4,882,656

[45] Date of Patent: * Nov. 21, 1989

[54] SURFACE MOUNTED DECOUPLING CAPACITOR

[76] Inventors: L. William Menzies, Jr., 938 Pleasant Hill Rd., Redwood City, Calif. 94061; Stephen W. Menzies, 4906 Colusa St., Union City, Calif. 94587

[*] Notice: The portion of the term of this patent subsequent to Oct. 18, 2005 has been disclaimed.

[21] Appl. No.: 258,242

[22] Filed: Oct. 14, 1988

Related U.S. Application Data

[63] Continuation-in-part of Ser. No. 941,454, Dec. 12, 1986, Pat. No. 4,779,164.

[51] Int. Cl.⁴ .............................................. H05K 7/10
[52] U.S. Cl. .................................... 361/393; 361/306; 361/396; 361/400; 361/417
[58] Field of Search ..................... 357/70, 72, 74, 75; 361/306, 396, 393, 398, 400, 405, 406, 414, 417–420

[56] References Cited

U.S. PATENT DOCUMENTS

| | | | |
|---|---|---|---|
| Re. 31,929 | 6/1985 | Donaher et al. | 361/396 |
| 4,519,658 | 5/1985 | Biswar | 361/393 |
| 4,779,164 | 10/1988 | Menzier, Jr. et al. | 361/396 |

Primary Examiner—Gregory D. Thompson
Attorney, Agent, or Firm—Skjerven, Morrill, MacPherson, Franklin & Friel

[57] ABSTRACT

A decoupling capacitor is mounted on a thin auxiliary board and connected by metallization traces on the board to a single pair of plug-in contacts press-fitted into a pair of apertures in a pair of integral tabs extending from the board. The auxiliary board and capacitor height is not more than about 0.070 inches. The plug-in contacts are pluggable into a pair of sockets in a printed circuit board. The auxiliary insulative board with its attached capacitor is sandwiched between a surface of a printed circuit board having a plurality of sockets, and the underside of a dual-in-line (DIP) integrated circuit package. At least two leads of the DIP package are inserted into the pair of insertable contacts in the auxliary isulative board while the remainder of the DIP package leads are inserted directly into other sockets in the printed circuit board. In one embodiment, other DIP leads pass through clearance holes in a second pair of integral tabs. Another embodiment provides for redundant capacitors each connected to separate pairs of contacts on the auxiliary board for interconnection of two ground leads and two power leads of the DIP to respective PC board sockets.

6 Claims, 2 Drawing Sheets

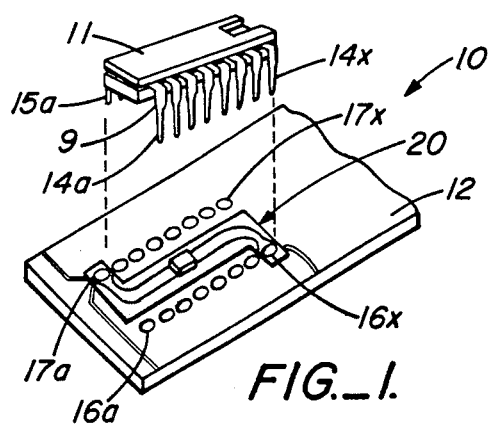
FIG._1.
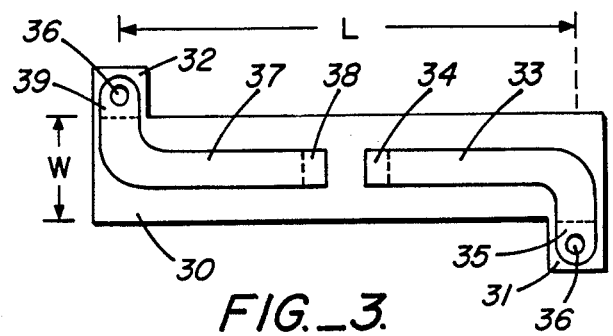
FIG._3.
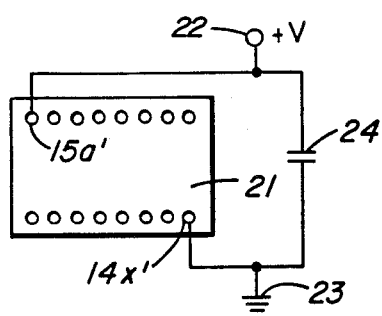
FIG._2.
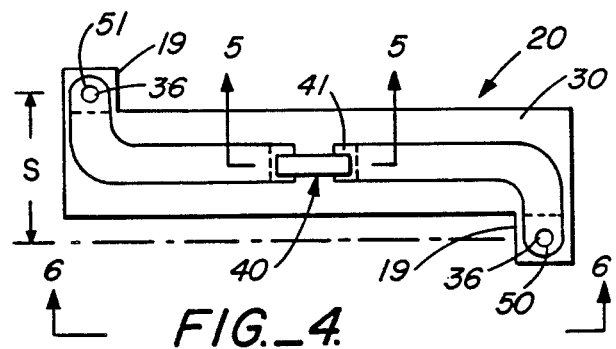
FIG._4.
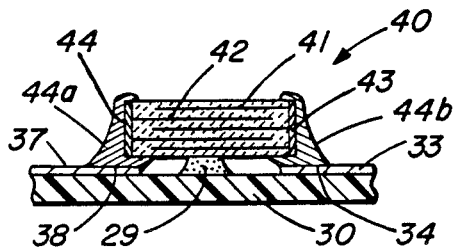
FIG._5.
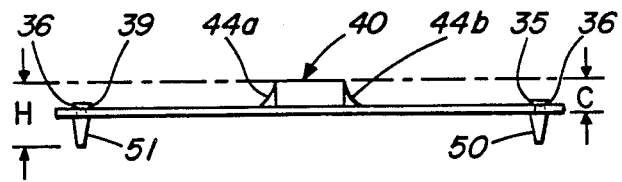
FIG._6.
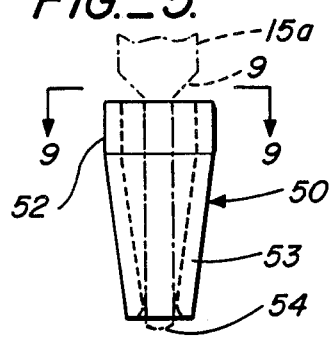
FIG._8.
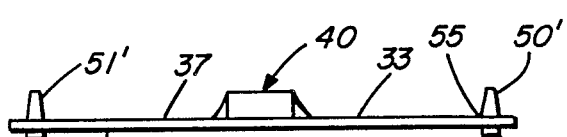
FIG._7.
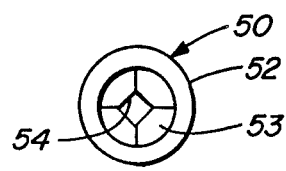
FIG._9.
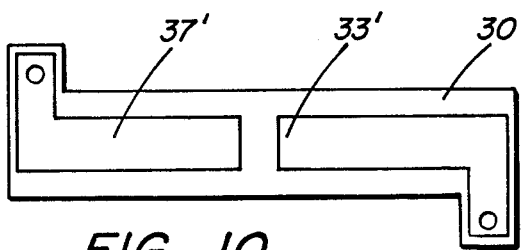
FIG._10.

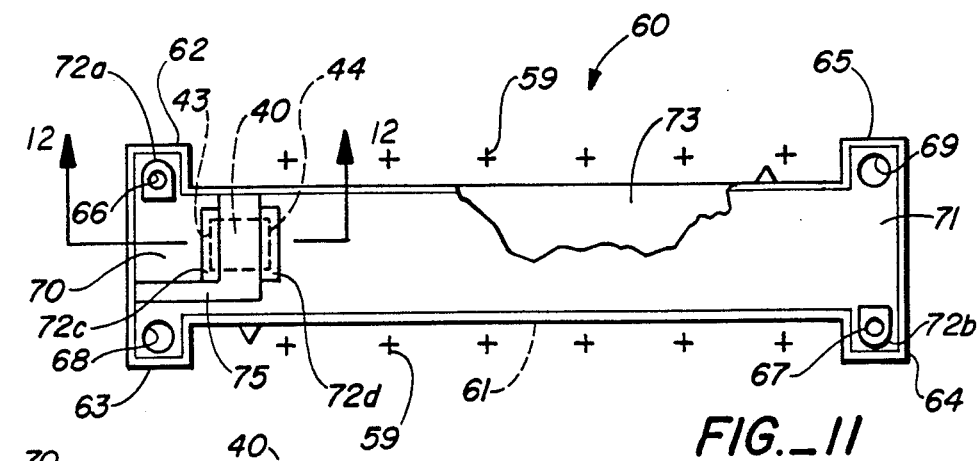
FIG._11
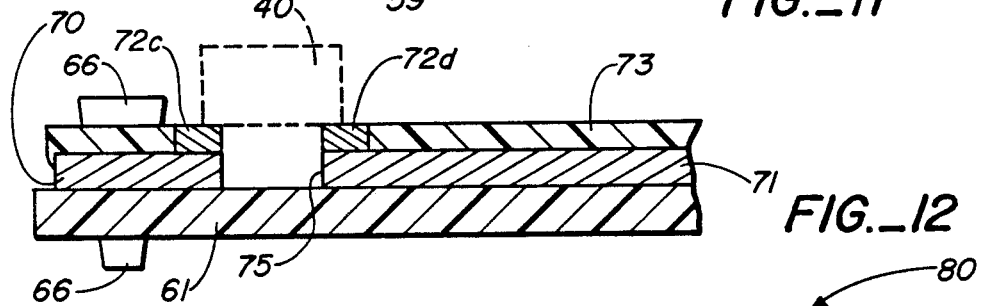
FIG._12
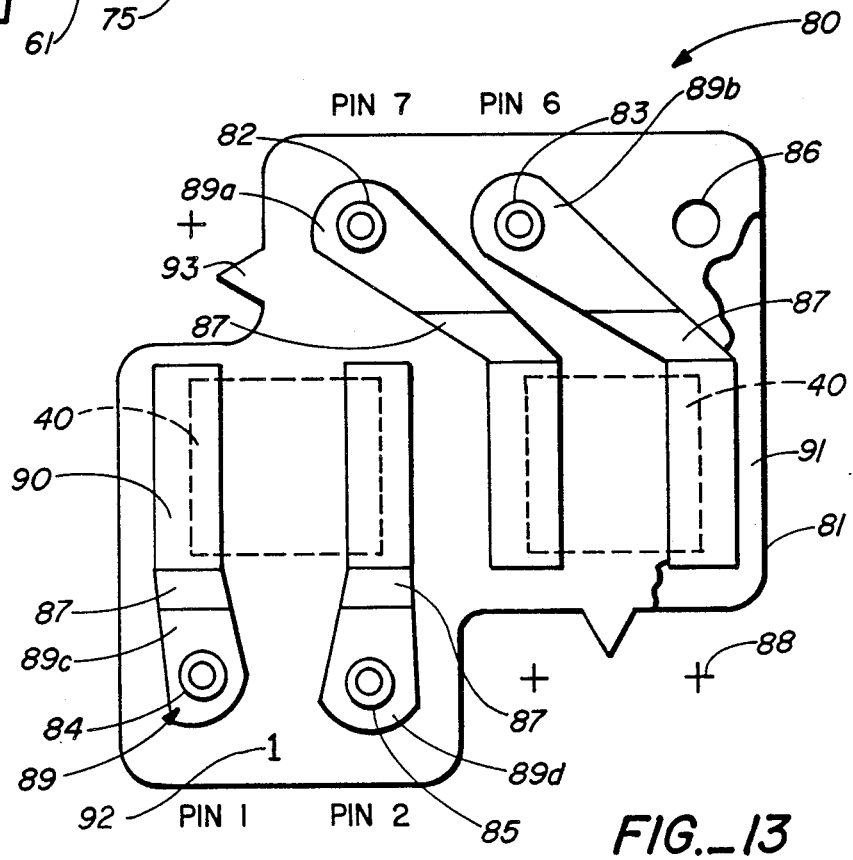
FIG._13

SURFACE MOUNTED DECOUPLING CAPACITOR

RELATED APPLICATION

This application is a continuation-in-part of U.S. Ser. No. 06/941,454 filed Dec. 12, 1986, now U.S. Pat. No. 4,779,164 issued Oct. 18, 1988.

FIELD OF THE INVENTION

This invention is directed to a capacitor filter providing a low impedance and low inductance decoupling loop to reduce circuit voltage noise for insertion into a printed circuit (PC) board without redesign or special socketing of the PC board. The invention finds particularly utility with standard dual-in-line packaged (DIP) integrated circuits.

BACKGROUND OF THE INVENTION

Previously, the addition of a capacitor filter to a PC board was made by mounting a prefabricated radial or linear ceramic capacitor or other capacitor having connecting leads extending therefrom on the PC board between two or more DIP positions on the board. Such mounting used PC board space which otherwise could have been allocated to additional DIP positions, other components or board metallizations. Thus, the number of DIP positions were decreased by the space used by the mounted ceramic capacitors. More recently, products have been marketed which (1) use a four lead flat insulated metal capacitor on an insulative board, with the four pins extending from the package. The metal film capacitor is placed under a DIP package and each of the four pins share a PC board mounting hole with a DIP lead pin (sold by Rogers Corp. under the trademark "MicroQ");

(2) use a multi-socket auxiliary board having the same size and number of sockets as the DIP package has pins and which is interposed between the PC board and the underside of the DIP package. A capacitor is fixed on the socket board and connected by circuit traces with two of the multi-sockets (sold by Electronic Molding Corp. under the trademark "The Silencer"); and (3) use other multi-socket auxiliary boards with standard leaded capacitors (sold by Advanced Interconnections and Garry New Quiet Sockets). Each of these prior art auxiliary boards have a relatively high height which can interfere with clearance requirements of the PC board or are relatively expensive items. Particularly, items (2) and (3) require the use of from 6 to 48 relatively expensive sockets on each auxiliary board with attendant high assembly costs.

The present invention allows inexpensive decoupling of all IC positions on a PC board without redesign or special socketing on existing production boards. On a new PC board product it saves costs and layout time with increased package density on the PC board or results in a smaller PC board size. It is simple to install and has no easily bendable parts which can cause misalignment problems during hand or automatic insertion on a PC board. The present invention is a surface mounted device compatible with the latest surface mount technology.

SUMMARY OF THE INVENTION

This invention involves an improvement in capacitor filters for use with integrated circuit (IC) packages and the printed circuit (PC) boards into which the packages are inserted. A relatively inexpensive auxiliary board of an overall size including particularly a small overall thickness is provided, which permits the capacitor-containing board to be positioned between the underside of dual-in-line (DIP) IC Package and the PC board into which the DIP is plugged. The auxiliary board thus is positioned within the same PC board space (area) as the DIP with which it is associated. Thus, there is no space penalty in utilizing this auxiliary capacitor board. No redesign or additional socketing of the PC board is necessary. The capacitor board may be mounted in an alternative configuration on the underside of the PC board where it can contact the protruding leads of a DIP package inserted into sockets accessed on the top of the PC board. A bare minimum of parts are used in construction which makes for an inexpensive device and one which can be easily and reliably inserted by automatic insertion means into the PC board or on the DIP package leads.

The above advantages are obtained by providing a thin insulative auxiliary board of a substantially rectangular shape with integral end tabs extending from opposite corners on opposite ends of the board. Two serpentine metallic traces are deposited on the board extending from apertures formed in the two tabs to a central board location at which position a decoupling capacitor is mounted and electrically connected to the traces. A single pair of hollow electrical insertable contacts are mounted in the tab apertures which are spaced apart the same distance as the spacing of the two PC board sockets (typically a ground socket and a power source voltage socket). The pair of plug-in contacts contact the metal traces leading from the capacitor leads. In use the auxiliary capacitor board two contacts are inserted into the two concerned sockets of the PC board so that the auxiliary board is flush with the PC board. The DIP package is then inserted over the auxiliary board so that appropriate power and ground leads of the DIP package are inserted into the interior of the two auxiliary board hollow contacts making connection through those contacts to the counterpart PC board sockets. In a further embodiment the auxiliary capacitor board may be mounted on the underside of PC board by engaging the insertable contacts in the auxiliary board tabs with the underside of the appropriate PC board socket positions. The DIP leads are inserted into the PC board socket positions, i.e. holes, from the top component side of the PC board. Two of the DIP leads protruding from the bottom side of the PC board pass into the center of the insertable contacts mounted in the auxiliary board tabs.

In another embodiment four tabs are provided, one at each corner of a generally rectangular substrate (the auxiliary board) which then has the outline of a flat H-shape or a block I dependent on orthogonal orientation. Contacts are positioned on two diametrical opposed tabs or legs with clearance holes (non-plated through) on the other two diametrically opposed tabs or legs. Power and ground leads from the DIP package pass into electrical connection with the pair of contacts while two other leads of the DIP pass through the clearance holes without any electrical contact and into two of the remaining sockets of the printed circuit board aligned with the clearance holes of the decoupling assembly. The remainder of the DIP leads pass past the auxiliary board to the still remaining sockets of the PC board.

In an additional embodiment two spaced pairs of contacts are provided on opposite sides of the auxiliary board or insulative substrate, which has a block L-shape with a first pair of contacts on a vertical margin of the L-shape and connected respectively to opposed sideplates of a first decoupling capacitor, and a second pair of contacts on a vertical margin of the L-shape base which are connected respectively to opposed sideplates of a second decoupling capacitor. A first DIP power lead and a first DIP ground lead are simultaneously inserted into one of the edge pairs of contacts and a second DIP power lead and a second DIP ground lead are inserted into the opposed spaced other pair of contacts. This provides a pair of decoupling capacitors resulting in a redundant decoupling capability.

BRIEF DESCRIPTION OF THE DRAWINGS

FIG. 1 is a perspective view of the auxiliary capacitor board of the invention mounted on a printed circuit board in a position to receive a DIP integrated circuit package.

FIG. 2 is a schematic diagram of an integrated circuit chip and capacitor with power and ground connections.

FIG. 3 is a plan view of the auxiliary board during an intermediate stage of fabrication.

FIG. 4 is a plan view of a completed auxiliary capacitor board.

FIG. 5 is a cut-away cross-section view of the capacitor as mounted on the auxiliary capacitor board taken along the line 5—5 of FIG. 4.

FIG. 6 is a side view of one embodiment of the auxiliary capacitor board suitable for top side insertion on a printed circuit board taken on the line 6—6 of FIG. 4.

FIG. 7 is a side view of a second embodiment of the auxiliary capacitor board suitable for insertion on the underside of a printed circuit board.

FIG. 8 is a side view of a hollow insertable contact suitable for use in the auxiliary capacitor board.

FIG. 9 is an end view of the open end of the hollow insertable contact of FIG. 8.

FIG. 10 is a plan view of a further embodiment of an auxiliary board at an intermediate state of manufacture.

FIG. 11 is a partially broken away plan view of a further embodiment of the invention.

FIG. 12 is a partial cross-section view taken on the line 12—12 of FIG. 11.

FIG. 13 is a plan view of another embodiment of the invention showing redundant decoupling assemblies.

DETAILED DESCRIPTION

The combination 10 of this invention is seen in FIG. 1 where a dual-in-line (DIP) integrated circuit package 11 is normally insertable into a series of sockets 16a through 16x and 17a through 17x in a printed circuit (PC) board 12. As is known in the art, the number of DIP terminal leads 14a through 14x and 15a through 15x on the DIP may range from 8 to 16 to 24 to 48 or more pins. Leads of the series of leads 15a through 15x, other than lead 15a, are not shown in the drawing since they are obscured in the view presented. They extend parallel to leads 14a through 14x and are inserted into sockets 17a through 17x of the printed circuit board. A degree of standardization has been provided by the semiconductor industry so that certain of the pins are designated as ground pins and certain of the pins are designated as power pins, the latter providing a source of voltage for powering the integrated circuit within the DIP package. The decoupling capacitor and interconnections provide a low impedance and low inductance decoupling loop which results in a reduced voltage noise within the integrated circuits. It has been known to place decoupling capacitors across the power and ground leads. In the present invention, an auxiliary capacitor board 20 with a single pair of hollow insertable contacts is provided which is insertable into two selected sockets 16x and 17a of the PC board 12. The auxiliary capacitor board 20 is mounted flush with PC board 12 so that a minimum height space is taken up by the auxiliary capacitor board. Details of the auxiliary capacitor board are seen in FIGS. 3–10 below. After insertion of the auxiliary capacitor board into the appropriate ground and power sockets of the PC board, the DIP package is inserted into the corresponding of socket 16a through 16x and 17a through 17x of the sockets PC board by insertion of the DIP leads 14a through 14x and 15a through 15x into the corresponding sockets. DIP leads 15a and 14x as shown will be insertable into socket 17a and 16x by passage through the internal fingers of the pair of hollow insertable contacts contained in the auxiliary capacitor board.

FIG. 2 illustrates in simplified form the schematic electrical circuit involved. Lead 14x' and lead 15a' of the integrated circuit chip 21 are connected respectfully to ground 23 and a voltage source 22. Connected between the voltage source and ground is a capacitor 24. Capacitor 24 functions to reduce voltage noise spikes and by that action can cut noise up to a factor of 10.

FIG. 3 illustrates the initial fabrication steps involved in fabrication of the auxiliary decoupling capacitor board. A substrate board 30 is provided of suitable insulative board material such as 0.020±0.0030 FR-4 per Mil Spec P-055617 and Mil P-13949G which is an electrolytic copper clad (1 oz. one side) epoxy fiberglass insulation. As a last step in the fabrication of the auxiliary board 20, notches 19 are routed out of an overall board containing a multiplicity of auxiliary board units to form substrate square tabs 31 and 32 extending integrally from opposite corners of opposite sides of the board 30. An aperture 36 is drilled or punched in each tab at a spacing S (FIG. 4) corresponding to the distance between opposed terminal leads of the DIP package to be mounted on the auxiliary capacitor board 30, e.g. the distance between leads 14a and 15a (FIG. 1). The width W of board 30 between the tabs is less than the distance between the oppositely arranged sets of terminal leads extending from the DIP package. The tabs and more particularly apertures 36 are located so that they are spaced apart a distance L representative of the linear distance between the particular DIP leads representing a ground lead and a power lead of the DIP package. Conductive metal traces 33 and 37 are deposited on the substrate 30 and extend from the aperture in each of the tabs 31 and 32 to spaced contacts 34 and 38 at a central portion of the auxiliary board 30. The metal traces may be of electrolytic copper plate in accord with specification Mil-F-55561. Contact plating at the areas of contact of the respective hollow insertable contacts 50 and 51 and for proper connection of the solder to the metal traces may be a tin/nickel or gold/nickel plating or may be pure tin or pure gold. These contacts await connection of a suitable plate capacitor. The ends 35 and 39 of each trace surround aperture 36 so that when contacts 50, 51 are inserted within the aperture an electrical connection is made between the contact and the respective traces.

As seen in FIG. 5, in the next step of fabrication, a capacitor 40 is mounted and connected between trace contact ends 34 and 38. At the same time a pair of contacts 50 and 51 are inserted within apertures 36. Capacitor 40 comprises a series of interdigitated plates 41 and 42 which form a spaced stack of capacitor plates. Metal sideplates 43 and 44 representing first and second capacitor leads connect each of the interdigitated sets of plates 41 and 42, respectively, so that each set of interdigitated plates are interconnected. The multi-layer ceramic capacitor stack is adhered to the auxiliary board substrate 30 by suitable adhesive 29 and/or solder 44a and 44b utilized to electrically connect sideplates 44 and 43, respectively, to contacts 34, 38 and traces 33 and 37, respectively. The overall maximum height of the capacitor is approximately from 0.040 to 0.050 inches. A suitable typical capacitor having utility in this invention is Model EIA 1206 manufactured by Kyocera Co. The insertable contacts 50 and 51 as shown in FIG. 8 may be of the Model CM102 type, manufactured by Weiss-Aug. Co. of New Brunswick, N.J.

In FIG. 6, the insertable contacts of the auxiliary capacitor board extend from a side of board 30 opposite to the side of the board on which the capacitor 40 is mounted. In this embodiment the height C of the auxiliary capacitor board (and its capacitor) mounted flush to the top surface of the PC board is not more than about 0.070 inches. Such dimension minimizes the added height included by use of the auxiliary capacitor board while not interfering with a proper connection of the insertable contacts to the PC board sockets and to the plug-in of the appropriate pair of DIP terminal leads into the interior of insertable contacts 50 and 51. The critical dimension C is the aggregate of auxiliary board thickness and the ceramic capacitor height above the auxiliary board. In order to allow proper contact of the DIP terminal leads into the PC board sockets this dimension C must not be greater than about 0.070 inches. Otherwise the standoff 9 on the DIP leads will not allow the leads of the DIP to properly extend within the PC board sockets. The overall height H of the auxiliary board including the capacitor and the insertable contacts is about 0.14 inches. Each of the insertable contacts 50, 51 typically of a 0.085 inch length are press-fitted into apertures 36 and are in electrical contact with trace ends 35 and 39 of the metal traces on the board 30 leading to opposite leads of capacitor 40.

FIG. 7 shows an alternative embodiment in which contacts 50' and 51' extend outwardly from the same side of the board as the capacitor 40 is mounted and are connected at 55 to their respective metal traces 33 and 37 extending to the capacitor 40. The DIP package is inserted into the PC board from its top surface. The auxiliary capacitor board 20 is then plugged into the underside of the printed circuit board by contacts 50' and 51' insertable into the extended DIP pins coming through the PC board. The underside of the auxiliary capacitor board then may be wave soldered so that solder wicks up through the interior of the insertable contacts and solidifies the ends of the single pair of DIP terminal leads inserted in a gas-tight connection within the tines or flexible fingers of the insertable contacts 50' and 51'. Solder also wicks into the other DIP leads inserted directly into the PC board sockets. In this embodiment a terminal contact of shorter length typically 0.065 inches long is preferred and the overall height of the capacitor board is decreased.

FIGS. 8 and 9 illustrate the internal details of the insertable contacts. These contacts have a contact head 52 including an entrance 54, which head is insertable within the aperture 36 in each of the tabs and makes contact either within the aperture of 36 to a metal coated via or otherwise are electrically connected to their respective metal traces on the substrate 30. The insertable contacts 50, 51, typically made of beryllium copper 0.007 ¼ hard per specification QQ-C-533, contain four flexible fingers which taper to the aperture entrance 54 and engage the ends of the DIP terminal leads shown in FIG. 1. A 6-9 oz. insertion force is normally required.

FIG. 10 shows an additional embodiment of the invention wherein the traces 33' and 37' on substrate 30 are nonserpentine. In another embodiment the capacitor may extend crosswise of the auxiliary board 30, i.e., along the S-axis.

FIGS. 11 and 12 show an embodiment 60 in which insulative substrate 61, typically of the same material as substrate 30 (FIG. 3), mounts at one end an interdigitated plate ceramic capacitor 40 of the type described above. Typically the capacitor utilized conforms to Mil-C-55681B and has a value of 0.01 mf 50 v.±20% or 0.33 mf 50 v±20% or 0.10 mf 50 v.±20%, dependent on case size and application. A commercially available low profile capacitor used is sold by NOVACAP, Inc. under the trademark NOVACAP #1206 Z 104 M500 NTX. The substrate has a flat H-shape in the view shown (a block-I in an orthogonal direction) resultant from tabs 62, 63, 64 and 65 at each corner of an otherwise rectangular substrate. The substrate is screened with a soldermask maskant such as Dynachem PC 501, as is known in the art over a plane of 0.0014 inch thick 1 oz. copper coated on the substrate 61. Non-masked contact pad areas and an area of copper to be etched are provided as hereafter described. A first voltage plane 70 of the copper forming a first conductive pathway extends from one sideplate 43 of capacitor 40 to a first contact 66 in tab or leg 62. A second ground plane 71 of the copper forming a second conductive pathway extends from sideplate 44 along the substrate 61 to a second contact 67 in tab or leg 64. Contact pads 72a and 72b are tin-lead solder plated (Gyrex Reflow per Mil 55110-D) on the voltage plane 70 and ground plane 71 above tabs 62, 64, respectively, for reception of contacts 66, 67. Solder paste 44a, 44b (Mil QQS-571E) as seen in FIG. 5 is utilized to connect the respective capacitor side plates to rectangular solder coated copper voltage and ground plane pads 72c and 72d, respectively. The voltage and ground planes are separated by an etched out area 75 of the copper extending from orthogonal edges of the copper and between pads 72c and 72d. Soldermask maskant 73 extends over the outboard edges of the voltage and ground planes and the areas around pads 72a-d. Contacts 66, 67 correspond to and are of the same design as plug-in contacts 50, 51 in FIG. 6. Clearance holes 68, 69 are formed in other tabs or legs 63, 65, respectively. In assembly, a DIP or other IC power pin and ground pin are inserted into electrical connection with contacts 66, 67, respectively, while two other DIP pins merely freely pass through clearance holes 68, 69 without electrical connection therewith and into aligned sockets in a printed circuit board. The remaining DIP pins extend in a straight line as indicated by + positions 59 between the apertures in tabs 62, 65 and in tabs 63, 64. These pins are seated after assembly, into other aligned sockets in the printed circuit board.

FIG. 13 illustrates an embodiment which provides for a redundant capacitor. The overall substrate 81 is in the form of block L-shape when the device shown in FIG. 13 is rotated 90° counterclockwise so that numbered pins 6 and 7 are vertically disposed in the vertical leg of the block L-shape and numbered pins 1 and 2 are vertically disposed in the horizontal base or leg of the block L-shape, parallel to and on the opposite side of the substrte than pins 6 and 7. The assembly includes two pairs 82, 83 and 84, 85 of power/ground contacts mounted on solderplate pads 89a, 89b, 89c and 89d at aligned parallel portions on an angular insulative substrate 81. A clearance hole 86 is also provided to aid in plugging in the DIP integrated circuit. Each contact is connected to one sideplate of one of the two capacitors 40 by discrete metal plated conductive pathways or traces 87 or by etch separated portions of bare copper on the substrate 81. For example, a copper-clad substrate may be etched so that the only remaining copper are the longitudinal traces 87 extending from around the contact apertures to a position parallel to and juxtaposed to its particular capacitor sideplate. Rectangular solderplate pads 90 are provided over the inboard ends of traces 87 and the respective capacitor sideplates solder connected thereto. A soldermask 91 utilizing Dynachem PC 501 is used over the substrate and the copper traces to provide openings for reception of solder forming the contact pads 89a–d and solderplate pads 90. Two 0.10 mf±20% 50 v. low profile (0.035 inch high) capacitors such as a NOVACAP #1210 B 104 M500 NTX type may be employed. As shown, pins 1 and 7 of a DIP integrated circuit are connected to power contacts 84 and 82, respectively, while pins 2 and 6 are connected to ground contacts 85 and 83, respectively. The remaining DIP pins other than the pin freely passing through clearance hole 86 pass by the substrate at spacial positions shown by the + marks 88 and pass directly into the remaining sockets in a printed circuit board as shown in FIG. 1. As in the embodiment of FIG. 11, a solder mask is applied over bare copper and the substrate 81 with tin-lead or tin over nickel plating (Gyrex reflow) provided to form pads 89 and 92. An orientation pin, Pin 1, indicated by indicia 90 may be etched on the substrate to properly orient the auxiliary board 80 in a sandwich position between the DIP and a printed circuit board and its multiple aligned sockets. Connecting links 93 on the auxiliary board periphery may extend between auxiliary boards in a matrix sheet of auxiliary boards so that individual completed auxiliary boards can be broken away from the matrix for assembly with a DIP on a PC board.

It is seen that the present invention allows for end-to-end or side-by-side stacking of IC packages on a PC board without the loss of any intervening space dedicated solely to a capacitor for decreasing the noise in the integrated circuit within the respective packages.

The above description of embodiments of this invention is intended to be illustrative and not limiting. Other embodiments of this invention will be obvious to those skilled in the art in view of the above disclosure.

We claim:

1. In combination, a printed circuit board having a series of sockets, including at least one dedicated power socket and at least one dedicated ground socket and a surface mountable decoupling capacitor assembly, said assembly comprising:
    an insulative substrate;
    at least one pair of hollow insertable contacts connected to and extending through said substrate, each pair of said contacts being spaced being spaced from each other a distance representative of a distance between said at least one power socket and said at least one ground socket of said printed circuit board;
    at least one decoupling capacitor mounted on said substrate, each capacitor of said at least one capacitor having internal stacked interdigitated plates and opposed conductive sideplates connecting alternate ones of said stacked plates;
    a conductive pathway on a surface of said substrate extending from each one of said opposed conductive sideplates to one of said hollow insertable contacts of each of said at least one pair of contacts, and
    means connecting said pathways to said conductive sideplate, said assembly being insertable into said printed circuit board under a multi-lead pin integrated circuit package positioned on said printed circuit board or on a wave-solderable surface of said printed circuit board such that only one or more power lead pins and one or more ground lead pins of said integrated circuit package pass into electrical contact with respective ones of said at least one pair of contacts to interconnect with respective ones of said at least one power socket and said at least one ground socket of said printed circuit board, remaining ones of said lead pins being inserted into the remainder of said series of sockets of said printed circuit board without electrical connection with said conductive pathways.

2. The combination of claim 1 wherein said at least one pair of contacts is a single pair of contacts and said at least one decoupling capacitor is a single decoupling capacitor and wherein said substrate includes at least one pair of clearance holes spaced from said pair of contacts through which at least a pair of said remaining ones of said lead pins pass without electrical contact.

3. The combination of claim 2 wherein said substrate is H-shape having a cross portion extending between two opposed legs, each leg having upper and lower leg portions, said capacitor being mounted on said crossportion, one of said contacts being mounted on an upper portion of one leg and the other of said contacts being mounted on a lower leg portion of the other leg and one of said clearance holes being in a lower portion of said one leg and the other of said clearance holes being in an upper portion of said other leg opposed to said contacts.

4. The combination of claim 3 in which said at least one pair of contacts comprises at least two pairs of hollow insertable contacts connected to and extending through said substrate, each pair of contacts being connected by discrete ones of said pathways to respective opposed sideplates of at least two decoupling capacitors, each pair of contacts of said at least two pairs of contacts being electrically connectable to a power lead pin and a ground lead pin of said integrated circuit package, and wherein said remaining ones of said lead pins represent non-power, non-ground input/output pins from said integrated circuit package pluggable into remaining ones of said sockets of said printed circuit board.

5. The combination of claim 4 wherein one of said capacitors is redundant, each capacitor being connected by said pathways to each contact of one of each pair of said contacts.

6. The combination of claim 4 in which said substrate has a block L-shape, a first one of said pairs of contacts extending along a vertical margin of said L-shape and receiving a first power lead pin and first ground lead pin of said integrated circuit package and wherein a second one of said pairs of contacts extends vertically along a vertical portion of a horizontal base of said L-shape parallel to and on an opposite side of said substrate than said first one of said pairs of contacts, said second one of said pairs of contacts receiving respectively a second power lead pin and a second ground lead pin of said integrated circuit package.

* * * * *